United States Patent
Matsumoto et al.

[11] Patent Number: 6,034,632
[45] Date of Patent: Mar. 7, 2000

[54] SIGNAL CODING METHOD AND APPARATUS

[75] Inventors: Jun Matsumoto; Masayuki Nishiguchi, both of Kanagawa, Japan

[73] Assignee: Sony Corporation, Tokyo, Japan

[21] Appl. No.: 09/048,077

[22] Filed: Mar. 26, 1998

[30] Foreign Application Priority Data

Mar. 28, 1997 [JP] Japan .................... P09-078616

[51] Int. Cl.[7] .................................... H03M 7/00
[52] U.S. Cl. ............................... 341/200; 341/51
[58] Field of Search ................. 341/200, 51, 60, 341/76, 65

[56] References Cited

U.S. PATENT DOCUMENTS

| | | | |
|---|---|---|---|
| 5,128,757 | 7/1992 | Citta et al. | 358/133 |
| 5,136,374 | 8/1992 | Jayant et al. | 358/133 |
| 5,309,232 | 5/1994 | Hartung et al. | |
| 5,825,311 | 10/1998 | Kataoka et al. | 341/51 |
| 5,903,676 | 4/1999 | Wu et al. | 341/51 |

FOREIGN PATENT DOCUMENTS 63-268387   11/1988   Japan ................. H04N 7/133

OTHER PUBLICATIONS

V. Cuperman, Joint Bit Allocation and Dimensions Optimization for Vector Transform Quantization, IEEE Transactions on Information Theory, vol. 39, No. 1 (Jan. 1993).

Techniques de compression des signaux, pp. 134–139 (France 1995).

*Primary Examiner*—Brian Young
*Attorney, Agent, or Firm*—Jay H. Maioli

[57] ABSTRACT

A signal coding apparatus including normalization circuit 101 for carrying out a linear prediction or the like to extract features of an input signal and for carrying out whitening. The signal whitened is transmitted to a T/F (time axis/frequency axis) conversion circuit 102 where the signal is subjected to a conversion such as the Modified Discrete Cosine Transform so as to obtain a coefficient y on the frequency axis. This coefficient y is supplied to a quantization (scalar quantization (SQ) and vector quantization (VQ)) circuit 103. A bit allocation circuit 104 uses the coefficient y and parameters such as a Linear Predictive Coding coefficient and a pitch from the normalization circuit 101 for carrying out quantization bit allocation for each coefficient. The quantization (SQ and VQ) circuit 103, according to this allocation bit, controls whether to carry out the SQ or VQ for each coefficient.

13 Claims, 4 Drawing Sheets

SIGNAL CODING METHOD AND APPARATUS

BACKGROUND OF THE INVENTION

1. Field of the Invention

The present invention relates to a signal coding method and apparatus in which an input signal is time axis/frequency axis converted for quantization and more particularly, to a signal coding method and apparatus which can preferably be used when coding an audio signal with a high efficiency.

2. Description of the Prior Art

Conventionally, various signal coding methods are known for carrying out a signal compression by utilizing statistical characteristics in a time region and a frequency region of an audio signal (including a sound signal and an acoustic signal) and characteristics of the human hearing sense. Such coding methods can be divided into a coding in a time region, a coding in a frequency region, an analysis-synthesis coding, and the like.

When coding an audio signal, especially an acoustic signal or a music signal, more consideration is taken on the sound quality rather than the quantization efficiency. For this, a quantization by way of scalar quantization is generally used and accordingly, the lower limit of the sign bit rate is comparatively high.

However, in a rapid progress of communication media into the multimedia system, it is required to provide a technique for reduced rate coding while suppressing deterioration of the sound quality.

To cope with this, introduction of a vector quantization is required, but in the vector quantization, is productivity of a so-called isolated spectrum, i.e., some peak portions present in an audio signal spectrum are not preferable and it is desired to improve it.

SUMMARY OF THE INVENTION

It is therefore an object of the present invention to provide a signal coding method and apparatus capable of increasing reproductivity of an isolated spectrum which is a peak portion as well as to increase the sound quality while realizing a reduced rate by way of vector quantization.

In order to achieve the aforementioned object, the present invention is characterized in that an input signal is subjected to a time axis/frequency axis conversion so as to obtain a coefficient on the frequency axis and according to a bit allocation of the coefficient, a scalar quantization and a vector quantization are controlled to be carried out to the aforementioned coefficient.

As a control method between the scalar quantization and the vector quantization, there can be exemplified a selective method to carry out the scalar quantization for coefficients on the frequency axis having allocation bits equal to or above a predetermined threshold value.

Here, the vector quantization is carried out with weight 0 for the coefficients which have been subjected to the scalar quantization, so as to ignore among the vector quantization outputs, those outputs corresponding to the coefficients quantized by the aforementioned scalar quantization, which outputs are replaced by the outputs of the aforementioned scalar quantization for output.

Moreover, for a coefficient which has been quantized by the scalar quantization, a quantization error of the coefficient is used as an input to the vector quantization and an output of the vector quantization is added to an output of the aforementioned scalar quantization for output.

The aforementioned vector quantization is carried out by dividing an input vector into a plurality of sub-vectors, so that a plurality of codebooks are switched from one to another according to the bit allocation corresponding to each of the sub-vectors.

Moreover, it is preferable to normalize a time axis signal by feature extraction prior to being subjected to the aforementioned time axis/frequency axis conversion and to use a parameter of this normalization for calculating the aforementioned allocation bit.

Furthermore, it is possible to carry out the aforementioned vector quantization to a plurality of sub-vectors obtained by interleaving an input vector.

A coefficient on the frequency axis which has inferior reproductivity by the vector quantization can be quantized by scalar quantization.

DETAILED DESCRIPTION OF THE PREFERRED EMBODIMENTS

Description will now be directed to preferred embodiments of the present invention with reference to the attached drawings.

Figure 1:
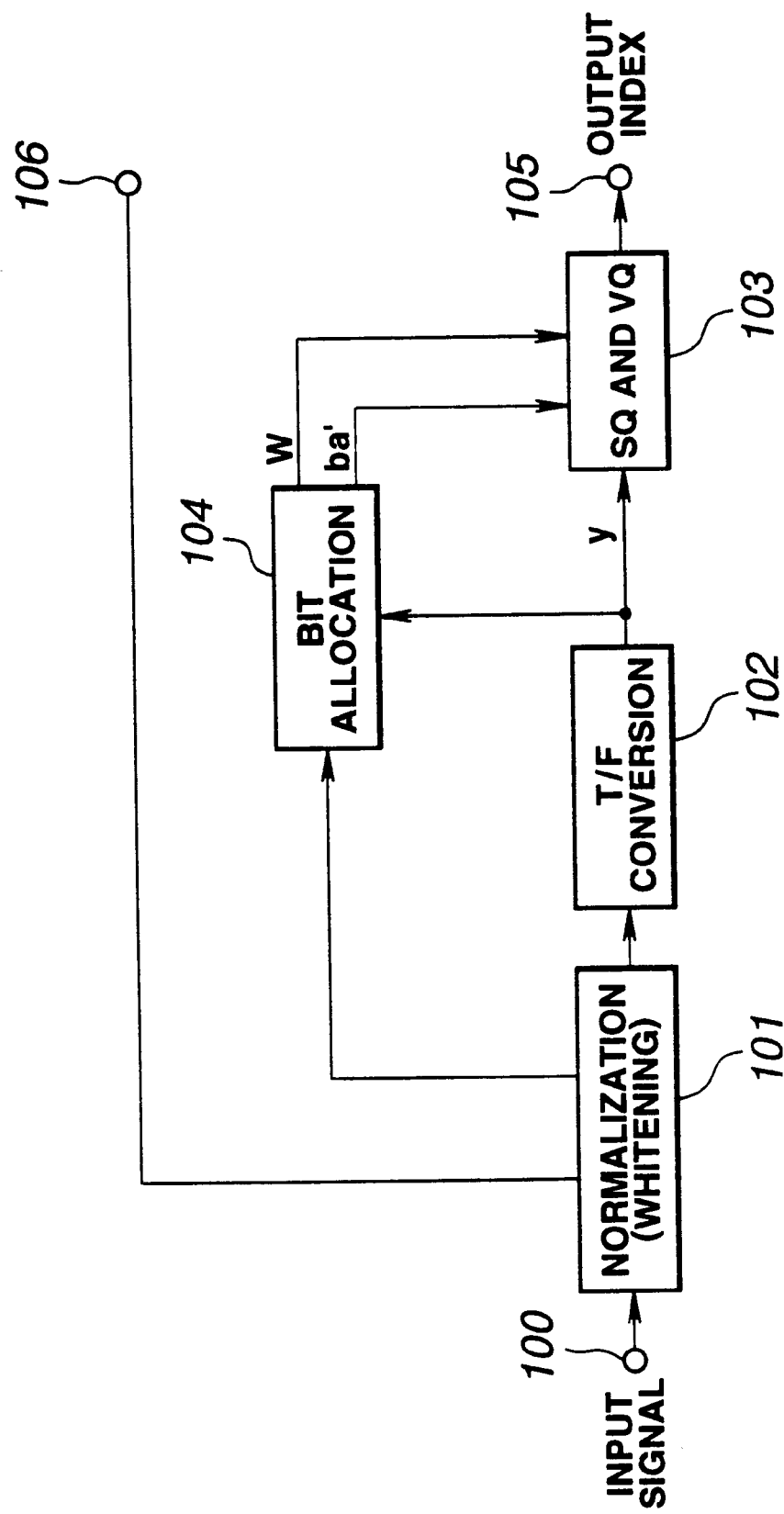
FIG. 1 is a block diagram showing a basic configuration of an embodiment of the present invention.

FIG. 1 is a block diagram showing a basic configuration of a signal coding apparatus according to an embodiment of the present invention.

In FIG. 1, an input terminal 100 is supplied with a waveform signal on the time axis, for example, an audio signal. More specifically, there can be exemplified a so-called wide band audio signal on the order of 0 to 8 kHz with a sampling frequency Fs of 16 kHz. However, the present invention is not to be limited to such a signal.

An input signal from the input terminal 100 is supplied to a normalization circuit 101. This normalization circuit 101 is also called a whitening circuit where a whitening is carried out by extracting features of the time waveform signal supplied, so as to take out a prediction residue. The whitening of the time waveform can be carried out by a linear prediction or non-linear prediction. For example, the input time waveform signal can be whitened by way of the linear predictive coding (LPC) and the pitch analysis.

The time waveform signal whitened is transmitted from this normalization circuit 101 to a time axis/frequency axis conversion (T/F mapping) circuit 102 where the signal is converted into a frequency axis signal. For this T/F mapping, an orthogonal conversion is often used such as the discrete cosine transform (DCT), the modified DCT (MDCT), the fast Fourier transform (FFT) and the like. A parameter such as an MDCT coefficient or FFT coefficient obtained in the T/F conversion circuit is fed to a quantization circuit 103 serving as quantization means where scalar quantization (SQ) and vector quantization (VQ) are carried out in combination. If the coefficient obtained from this T/F conversion for each frame is assumed to be an N-dimensional vector y, in order to carry out an effective quantization of this coefficient vector $y=(y(0), y(1), \ldots y(N-1))^t$, it is necessary to determine a quantization bit allocation for each coefficient. This bit allocation can be obtained from a hearing sense masking model or more simply, from the parameter such as the LPC coefficient obtained during whitening in the aforementioned normalization circuit 101 and an amount p (i) calculated from the aforementioned coefficient y. Hereinafter, this p (i) will be referred to as a bit allocation determination index. A specific example of the bit allocation determination index p(i) will be detailed later.

The bit allocation circuit 104 calculates an allocation bit according to the aforementioned parameter obtained in the normalization circuit 101 and the coefficient y from the T/F conversion circuit 102. Generally, an allocation bit ba(i), i.e., a bit allocation for the i-th coefficient can be expressed as follows by using the aforementioned bit allocation determination index p(i).

$$ba(i)=\log_2(p(i))+q$$

wherein q represents a correction amount for generalization. A total number of bits B allowed for coefficient quantization within one frame should be a constant value or a value near the constant value and accordingly, the aforementioned correction amount q is determined as follows.

$$q = \frac{B - \sum_{i=0}^{N-1} \log_2(p(i))}{N} \quad \text{[Expression 1]}$$

According to the allocation bit ba(i) obtained for each coefficient, control is carried out for scalar quantization (SQ) and vector quantization (VQ). More specifically, for example, an allocation bit threshold value is determined in advance, so that the scalar quantization and the vector quantization is selected on a condition as follows:

If $ba(i) \geq bSQ$, then scalar quantization (SQ).

If $ba(i) < bSQ$, then vector quantization (VQ).

Because the aforementioned allocation bit ba(i) is not an integer, it cannot be used directly for the normal scalar quantization. From the ba(i), an integer value f(ba(i)) is used as the quantization bit for carrying out the scalar quantization. The following is an example of the f(x), wherein rint(x) is a function to give an integer nearest to the x.

$$f(x) = \begin{cases} b_{high} & (x \geq b_{high}) \\ \text{rint}(x) & (b_{high} > x \geq b_{SQ}) \\ x & \text{other (for VQ)} \end{cases} \quad \text{[Expression 2]}$$

In this Expression, as the values of the $b_{SQ}$ and $b_{high}$, there can be exemplified $b_{SQ}=2$ and $b_{high}=4$. However, they are not limited to these values.

If the number of allocation bits is made into an integer in this way, the necessary number of bits in the final frame adjusted by the aforementioned correction q will cause a great difference. Consequently, q' which makes the following Expression near to B is searched in the vicinity of q.

$$\sum_{i=0}^{N-1} ba'(i) = \sum_{i=0}^{N-1} f(\log_2(p(i)) + q') \quad \text{[Expression 3]}$$

With this q', the final allocation bit ba'(i) is determined for each of the coefficients.

The bit allocation circuit 104 determines such ba'(i) which is transmitted to the quantization (SQ and VQ) circuit 103. In the quantization (SQ and VQ) circuit 103, according to this allocation bit ba'(i), the scalar quantization (SQ) and vector quantization (VQ) are controlled. More specifically, as has been described above, scalar quantization (SQ) is carried out for coefficients equal to or above a predetermined threshold value and vector quantization is carried out for the other coefficients. In this case, if vector quantization is carried out for the remaining coefficents after excluding the coefficients subjected to the scalar quantization, the number of coefficients to be subjected to scalar quantization may vary from frame to frame and accordingly the number of dimensions of the vector quantization may vary from to frame. Consequently, it is preferable to fix the number of dimensions of the vector quantization to the total number N of all the coefficients. For example, if there is a coefficient which has been quantized by the SQ among all the coefficients to be subjected to quantization, that coefficient is subjected to vector quantization with weighting 0 and in the VQ output, the result for that coefficient is ignored so as to be replaced by an SQ output. Here, it is preferable that the vectors to be subjected to quantization be divided into a plurality of sub-vectors, so that the vector quantization is carried out for each of the sub-vectors, and a plurality of codebooks are selectively used according to the number of allocation bits for the respective sub-vectors.

Moreover, the bit allocation circuit 104 calculates a weight w(i) for hearing sense weighting in the vector quantization (VQ) in the quantization (SQ and VQ) circuit 103, and the w(i) calculated is fed to the quantization (SQ and VQ) circuit 103. This weight w(i) will be detailed later.

An output index from the quantization (SQ and VQ) circuit 103 is fetched from an output terminal 105, whereas the parameters such as the aforementioned LPC coefficient and the pitch from the normalization circuit 101 are fetched from an output terminal 106.

Figure 2:
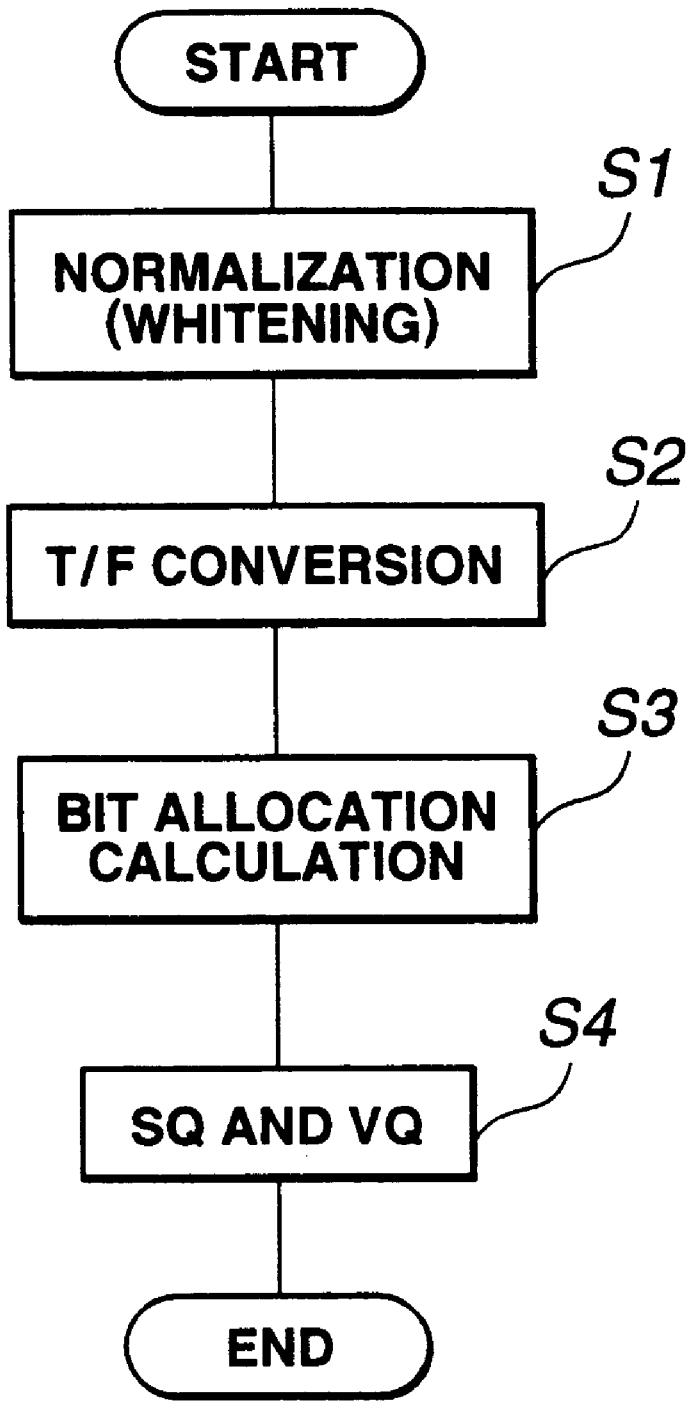
FIG. 2 is a flowchart for explanation of an operation according to an embodiment of the present invention.

Although the signal coding apparatus of FIG. 1 is shown as a hardware configuration, it can also be realized as software by using a digital signal processor (DSP) and the like. FIG. 2 is a flowchart showing a signal coding procedure in such a case. An embodiment of the present invention will be detailed below with reference to FIG. 2 and FIG. 1.

In FIG. 2, in step S1, a normalization processing is carried out for the aforementioned whitening, which corresponds to the aforementioned normalization circuit 101. Here, explanation will be given on the whitening with the linear predictive coding (LPC) and the pitch analysis.

A time waveform signal x(n) as an input signal is windowed by an appropriate time window function such as a Hamming window and an LPC coefficient is extracted. The LPC coefficient is converted into an LSP parameter and then quantized and interpolated. The LSP parameter which has been quantized is again made into an LPC coefficient, constituting an LPC reverse filter. The input time waveform signal x(n) is normalized or whitened through this LPC reverse filter, so as to obtain an LPC residue $r_1(n)$. Here, if the frame size is assumed to be N, an LPC residue $r_1'(n)$ of a preceding frame, i.e., past by one frame, is used to expand the definition region of the $r_1(n)$ from $0 \leq n < N$ to $-N \leq n < N$. In the region of $n<0$, the following $$r_1(n)=r_1'(n+N)$$

is defined and this $r_1(n)$ is used for pitch calculation. A pitch gain may be an analysis for a single point of a pitch, but in this example, in order to increase the accuracy of the pitch (periodicity, i.e., so-called pitch lag) and the pitch gain, three pitch gains $g_0$, $g_1$ and $g_{31\ 1}$ are calculated for the pitch center p and two points before and after the center $p \pm 1$.

$$\phi(k) = \sum_{n=0}^{N-1} (r_1(n) - g_{-1} r_1(n-k-1) - \quad [\text{Expression 4}]$$
$$g_0 r_1(n-k) - g_1 r_1(n-k+1))^2$$

The k which minimizes the above Expression is assumed to be a pitch p and three pitch gains at the three points with the center p constitutes a pitch gain vector $g=(g_{31\ 1}, g_0, g_1)$.

This pitch p and the pitch gain vector g are quantized to obtain a quantized pitch gain vector Q(g) which is used to constitute the pitch reverse filter, which in turn is used for normalizing the LPC residue $r_1(n)$ to obtain $r_2(n)$. This LPC residue $r_2(n)$ which has been normalized is supplied to the aforementioned T/F conversion circuit 102.

In step S2, the LPC residue $r_2(n)$ which is a time axis waveform is T/F (time axis/frequency axis) converted. For this T/F conversion, for example, the MDCT is used.

In step S3, calculation of the bit allocation is carried out, which corresponds to the bit allocation circuit 104 in FIG. 1. As has been described above, this bit allocation is calculated, for example, according to a hearing sense masking model or a parameter such as an LPC coefficient obtained in the aforementioned normalization (whitening) and the bit allocation determination index p(i) calculated from the aforementioned coefficient y. Moreover, in this step S3, a weight w(i) is also calculated for hearing sense weighting during a vector quantization (VQ) at a later stage.

Firstly, an explanation will be given on the aforementioned bit allocation determination index p(i).

The quantized LPC coefficient $Q(\alpha_i)$ (wherein i is assumed to be, for example, $1 \leq i \leq 10$) obtained in the aforementioned normalization (whitening), the pitch p, and the quantized pitch gain vector Q(g) are used to constitute an LPC synthesis filter and a pitch synthesis filter. These filters have transmission functions H(z) and P(z) which can be expressed as follows.

$$H(z) = \frac{1}{1 + \sum_{i=1}^{10} Q(\alpha_i)_z^{-i}} \quad [\text{Expression 5}]$$

$$P(z) = \frac{1}{1 - \sum_{i=-1}^{1} Q(g_i)_z^{-p+i}}$$

Moreover, the frequency response h(i) and pch(i) of the functions H(z) and P(z) are obtained. Here, i represents respective points on the frequency axis. Furthermore, the coefficient after the aforementioned T/F conversion is handled for each critical band width or the critical band width is further divided into blocks. A peak value $P_b(j)$ of the j-th block is fetched and quantized, so that the quantized value $Q(P_b(j))$ is used as a normalization factor of that block. Consequently, the aforementioned bit allocation determination index p(i) which is a general normalization factor on the frequency axis can be expressed as follows.

$$p(i)=h(i)pch(i)Q(P_b(j)) \quad (i \in \text{block } j)$$

Next, for the weighting, firstly, LPC and pitch hearing sense weighting filters are constituted. These filters have transmission functions $W_1(z)$ and $W_2(z)$ which, for example, can be expressed as follows.

$$W_1(z) = \frac{1 + \sum_{i=1}^{10} \gamma_1^i Q(\alpha_i)_z^{-i}}{1 + \sum_{i=1}^{10} \gamma_2^i Q(\alpha_i)_z^{-i}} \quad [\text{Expression 6}]$$

$$W_2(z) = \frac{1}{1 - \sum_{i=-1}^{1} \lambda Q(g_i)_z^{-p+i}}$$

Here, the constants $\gamma_1$, $\gamma_2$, and $\lambda$ may be, for example, $\gamma_1=0.8$, $\gamma_2=0.5$, and $\lambda=0.7$. However, the constants are not to be limited to these values.

The aforementioned weight w(i) can be calculated by using frequency responses $w_1(i)$ and $w_2(i)$ of the aforementioned functions $W_1(z)$ and $W_2(z)$ and $Q(P'_b(j))$ derived from the $Q(P_b(j)i)$ $$w(i)=w_1(i)w_2(i)Q(P'_b(j)) \quad (i \in \text{block } j)$$

As the aforementioned $Q(P'_b(j))$, for example, the following can be used, but not to limited to it.

$$A(P'_b(j))=(Q(P_b(j)))^r (0<r<1)$$

Next, explanation will be given with reference to FIG. 3, on the scalar quantization and the vector quantization carried out in step S4 of FIG. 2 or in the quantization (SQ and VQ) circuit 103 of FIG. 1.

Figure 3:
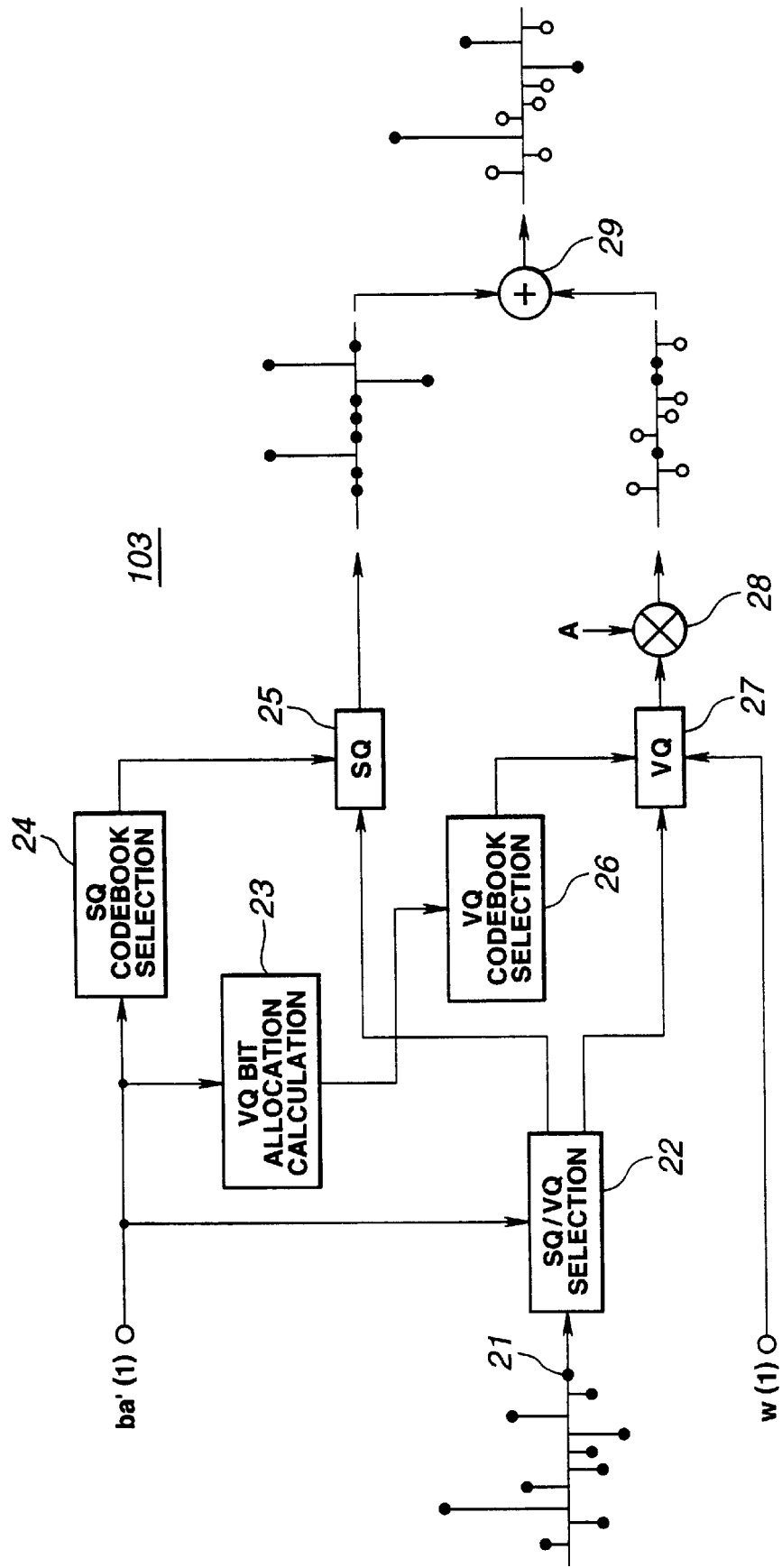
FIG. 3 if a block diagram showing a specific configuration for carrying out a scalar quantization (SQ) and a vector quantization (VQ).

In FIG. 3, an input terminal 21 is supplied with a coefficient vector $y=(y(0), y(1), \ldots y(N-1))^t$ consisting of N coefficients which have been subjected to the aforementioned T/F conversion. Here, it is assumed that $I_{SQ}$ is a set of indexes of the coefficients to be subjected to the scalar quantization (SQ) and $I_{VQ}$ is a set of indexes of the coefficients to be subjected to the vector quantization (VQ). That is, indexes of all the coefficients to be subjected to quantization are divided into the $I_{SQ}$ and $I_{VQ}$.

$$[0 \ldots N-1]=I_{SQ} \cup I_{VQ},\ I_{SQ} \cap I_{VQ}=0$$

The SQ and VQ are selected, as has been described above, according to the aforementioned bit allocation ba'(i) by an SQ/VQ selecter 22.

Firstly, scalar quantization is carried out for $i \in ISQ$. There can be a single codebook or a plurality of codebooks of the scalar quantization. The present embodiment uses codebooks S2, S3, and S4 having the quantization bit number 2, 3, and 4, respectively. An SQ codebook selecter 24 selects which of these codebooks is to be used, according to the aforementioned bit allocation ba'(i). An output Q(y(i)) which has been quantized by an SQ (scalar quantization) block 25 is obtained, by using $j=SQ_{index}$ which minimizes $|y(i)-S_{ba'(i)}(j)|^2$ in the range of $0 \leq j < 2^{ba'(i)}$, as follows.

$$y(i)=S_{ba'(i)}(SQ_{index})$$

The results of the scalar quantization (SQ) are collected to create a N-dimensional vector $y_{SQ}$. The i-th element $y_{SQ}(i)$ of this vector ($0 \leq i < N$) is as follows:

$$Q(y(i))_{SQ} = \begin{cases} Q(y(i)) & i \in I_{SQ} \\ 0 & i \in I_{VQ} \end{cases} \quad \text{[Expression 7]}$$

Next, explanation will be given on the vector quantization (VQ). The number of elements of the aforementioned index set IVQ varies from frame to frame. If these elements are collected so as to be subjected to vector quantization, adjustment of the number of the dimensions is complicated and a codebook required varies depending on the number of dimensions required. In the present embodiment, all the N are subjected to quantization with a fixed dimension. However, for those coefficients which have been already subjected to the scalar quantization, the vector quantization weighting is set to 0.

More specifically, firstly, N coefficients are divided into M-dimensional sub-vectors. For example, the coefficients are divided simply for each of the M dimensions, starting at a lower band. When the N/M sub-vectors are obtained, for the k-th sub-vector $$yk = (y(kM), y(kM+1), \ldots y(kM+M-1)^t$$

the weight vector obtained beforehand is also divided to create $w_k$. It should be noted that the j-th element $w_k(j)$ of $w_k$ is defined as follows.

$$W_k(j) = \begin{cases} w(kM+j) & (kM+j \in I_{VQ}) \\ 0 & (kM+j \in I_{SQ}) \end{cases} \quad \text{[Expression 8]}$$

In the same way as the aforementioned SQ case, it is possible to use a single VQ codebook or a plurality of VQ codebooks which are switched from one to another. Firstly, the total bit allocation $By_k$ of the sub-vector $y_k$ is calculated by the VQ bit allocation calculator 23 in FIG. 3. For example, an average bit allocation as follows can be used but the bit allocation is not to be limited to this.

$$B_{y_k} = \frac{\sum_{0 \le j < M, kM+j \in I_{VQ}} ba'(kM+j)}{\sum_{0 \le j < M, kM+j \in I_{VQ}} 1} \quad \text{[Expression 9]}$$

When the aforementioned $By_k$ is given, a mapping rule is predetermined for which codebook is to be used from the L codebooks ($C_0 C_1, \ldots C_{L-1}$). According to this mapping rule, a codebook $C_r$ is selected to be used for the sub-vector $y_k$. This codebook selection is carried out by a VQ codebook selector 26 in FIG. 3.

For the selected codebook $C_r$, if the bit allocation is assumed to be $B_r$, such m=$VQ_{index}$ is searched that minimizes $\|W_k(y_k - C_r(m))\|^2$ in a range of 0<m<2Br. Thus, a quantized output Q(yk) obtained from the vector quantization (VQ) block 27 through a multiplier 28 can be expressed as follows.

$$Q(yk) = ACr(VQindex) \quad \text{[Expression 10]}$$

wherein

Wk=diag(wk)

Cr(1) is the 1-th element vector of Cr.

$$A_{ij} = \begin{cases} 1 & (i = j \text{ and } kM+i \in I_{VQ}) \\ 0 & (\text{other}) \end{cases}$$

The multiplier 28 multiplies the matrix A of this Expression for the output from the VQ block 27.

The M-dimensional quantized output Q(yk) (0≦k≦N/M) obtained by the vector quantization are connected to one another, contrary to the aforementioned division, so as to create an N-dimensional vector $Q(y)_{VQ}$, which is added to the aforementioned scalar quantized output $Q(y)_{SQ}$ in an adder 29, so as to obtain the final output Q(y) of the quantization block for the N coefficients y as follows:

$$Q(y) = Q(y)_{SQ} + Q(y)_{VQ}$$

Here, it should be noted that by transmitting a parameter which determines the weight in quantization, it is possible to restore an operation identical to an encoder. That is, from the aforementioned bit allocation ba'(i) alone, it is possible to determine the coefficient index to be subjected to SQ (position information) and the codebook to be used in the SQ and VQ. Accordingly, the decoder can carry out interpretation and reverse quantization of the encoder output without any side information.

Next, explanation will be given on the audio signal coding apparatus as a more specific configuration example of the aforementioned embodiment with reference to FIG. 4.

Figure 4:
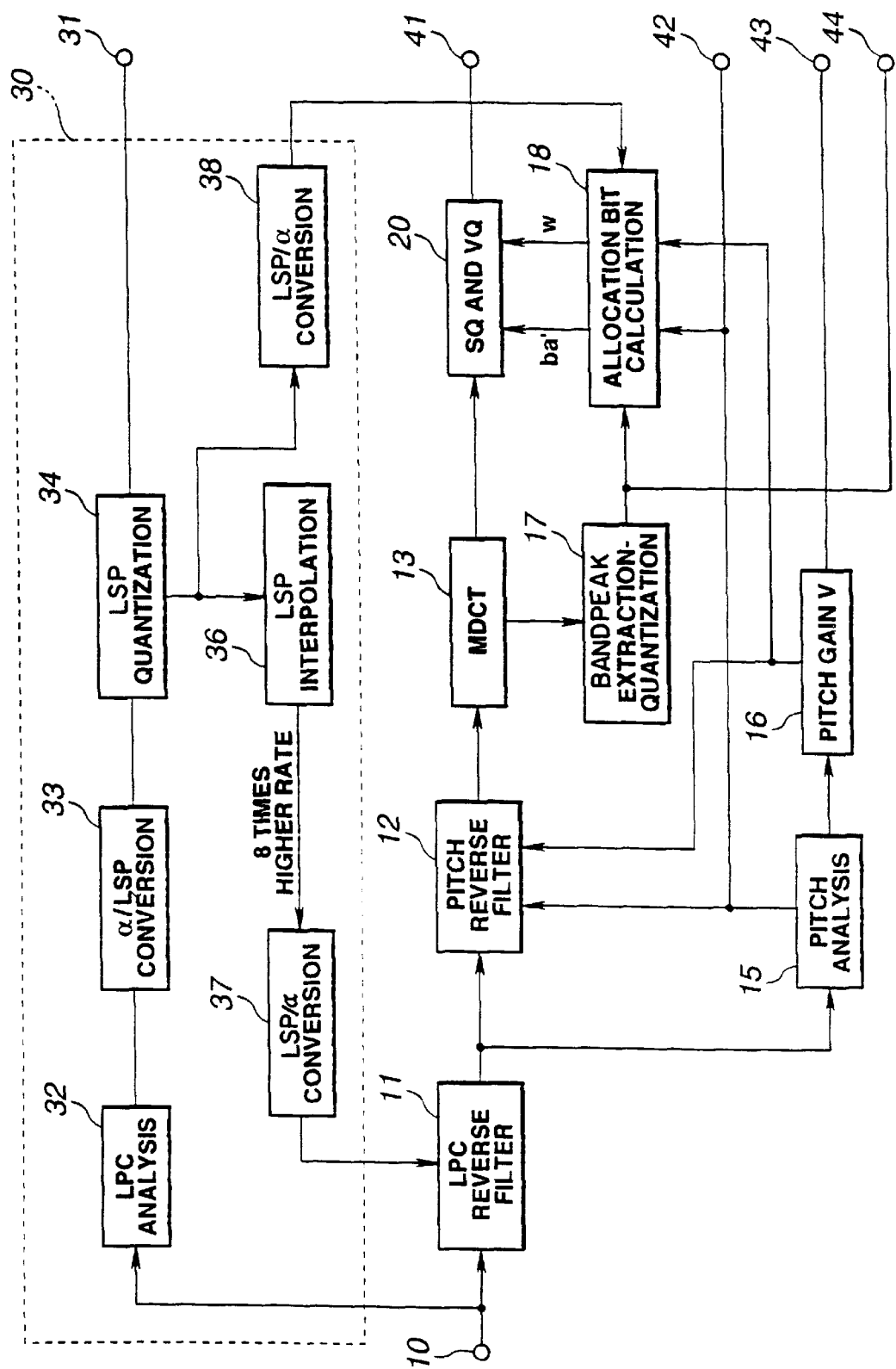
FIG. 4 is a block diagram showing a configuration exam of an audio signal coding apparatus according to an embodiment of the present invention.

In FIG. 4, an input terminal 10 is supplied with a digital audio signal obtained from A/D conversion of a so-called wide band audio signal of for example 0 to 8 kHz with the sampling frequency Fs=16 kHz. This input signal is supplied to an LPC analysis-quantiztion block 30 where it is subjected to a Hamming windowing with an analysis length of, for example, 1 frame for 512 samples, so as to calculate an LPC coefficient of about 10 dimensions, i.e., the α parameter, which is supplied to an LPC reverse filter 11 to obtain an LPC residue. For this LPC analysis, some of the 512 samples of a frame which is a unit of analysis are overlapped with the next block. In this LPC analysis-quantization block 30, the A parameter which is the LPC coefficient is converted into an LSP (linear spectrum pair) parameter so as to be quantized and is transmitted.

The α parameter from the LPC analysis circuit 32 is transmitted to an α/LSP conversion circuit 33 where it is converted into a linear spectrum pair (LSP) parameter. This means that the α parameters obtained as direct type filter coefficients are converted into, for example, 10 parameters, i.e., 5 pairs of LSP parameters. The conversion is carried out, for example, by using the Newton-Raphson method and the like. This conversion into LSP parameters is carried out because it is possible to obtain superior interpolation characteristics than with the α parameter.

The LSP parameter from the α/LSP conversion circuit 33 is subjected to a vector quantization or matrix quantization in an LSP quantizer 34. Here, it is possible to determine a difference between frames before carrying out the vector quantization or to collect a plurality of frames for the matrix quantization.

The quantized output from this LSP quantizer 34, i.e., the LSP vector quantization index is fetched from a terminal 31, and the quantized LSP vector or reverse quantization output are transmitted to an LSP interpolation circuit 36 and to an LSP/α conversion circuit 38.

The LSP interpolation circuit 36 carries out an interpolation of a pair of a current frame and a preceding frame of the LSP vector obtained from the vector quantization for each of the aforementioned frames in the LSP quantizer 34. This interpolation is carried out to obtain a rate which will be required later. In this example, interpolation is carried out for the 8 times higher rate.

In order to carry out a reverse filtering of the input sound by using the LSP vector thus interpolated, the LSP parameter is supplied to an LSP/α conversion circuit 37 where it is converted into an α parameter which is a coefficient of a direct type filter of about 10 dimensions. The output from this LSP/α conversion circuit 37 is supplied to an LPC reverse filter circuit 11 for obtaining the aforementioned LPC residue. In this LPC reverse filter 11, a reverse filtering is carried out with the α parameter which is updated with the 8 multiplication rate, so as to obtain a smooth output.

Moreover, a 1 multiplication rate LSP coefficient from the LSP quantization circuit 34 is supplied to the LSP/α conversion circuit 38 where it is converted into an α parameter, which is supplied to an allocation bit calculation circuit 18 for carrying out the aforementioned bit allocation. The allocation bit calculation circuit 18, besides the aforementioned allocation bit ba'(i), carries out calculation of the weight w(i) used for the quantization of the MDCT coefficient as has been described above.

The output from the LPC reverse filter 11 is supplied to a pitch reverse filter 12 and a pitch analysis circuit 15 which is used for a pitch prediction which is a long-term prediction.

Next, explanation will be given on the long-term prediction. The long-term prediction is carried out by subtracting a waveform displaced on the time axis by a pitch periodicity or pitch lag obtained by the pitch analysis, from the original waveform, so as to obtain a pitch prediction residue. In this example, this is carried out through 3-point prediction. Note that the pitch lag is a number of samples corresponding to a pitch periodicity of time axis data sampled.

That is, in the pitch analysis circuit 15, a pitch analysis is carried out for each one frame, i.e., the analysis length is one frame. Among the pitch analysis results, a pitch lag is supplied to the pitch reverse filter 12 and an output terminal 42, and a pitch gain is supplied to a pitch gain V circuit 16. In the pitch gain V circuit 16, pitch gains at the three points corresponding to the aforementioned 3-point prediction are subjected to vector quantization and a codebook index is fetched from the output terminal 43, so that a representative value vector or a reverse quantization output is transmitted to the pitch reverse filter 12. The pitch reverse filter 12, according to the aforementioned pitch analysis results, outputs a pitch prediction residue of the 3-point pitch prediction. This pitch prediction residue is supplied to orthogonal conversion means which is, for example, an MDCT circuit 13, where it is subjected to the MDCT processing before being subjected to the scalar quantization and the hearing sense weighting vector quantization by the aforementioned quantization (SQ and VQ) circuit 20. A critical band peak extraction-quantization circuit 17, as has been described above, for the coefficient which has been subjected to the MDCT processing which is a T/F conversion, dividing for each critical band width or further dividing the critical band width into blocks, fetches a peak value of each block so as to be quantized. This quantized value is supplied as a normalization factor of the block to the allocation bit calculation circuit 18 and taken out from an output terminal 44.

In the quantization (SQ and VQ) circuit 20, as has been described above, control is carried out to select SQ or VQ according to the bit allocation ba'(i) from the allocation bit calculation circuit 18, so that the scalar quantization is carried out for a part of the MDCT coefficients and the vector quantization is carried out for the remaining coefficients with the hearing sense weighting by the aforementioned VQ weight w(i).

By the way, in the aforementioned specific example, the vector quantization (VQ) is carried out for coefficients excluding those coefficients which have been subjected to the scalar quantization (SQ) (actually, the weight is set to 0 for the coefficients which have been subjected to the SQ). It is also possible to carry out the VQ at once for the quantization error of the coefficients which have been subjected to the SQ and the coefficients which are to be subjected to the VQ.

For example, if the coefficients which have been subjected to the scalar quantization (SQ) are assumed to be $q(y)_{SQ}$, a vector u is created to satisfy the following:

$$u = y - q(y)_{SQ}$$

This vector u is divided into sub-vectors uk (=$u_k(0)$, $u_k(1)$, ... $u_k(M-1)$). That is, $$u_k(j) = y(kM+j) - Q(y(kM-j))_{SQ}$$

After this division, quantization is carried out according to the aforementioned VQ procedure. In this VQ, the weight $w_k(j)$ can be simply defined as $$w_k(j) = w(kM+j)$$

The vector quantization is carried out with this weight and from this quantization result Q(u), the final result Q(y) can be obtained as follows.

$$Q(y) = Q(u) + Q(y)_{VQ}$$

In the above given explanation, scalar quantization is carried out prior to carrying out vector quantization. However, it is also possible to firstly carry out the vector quantization to all the coefficients on the frequency axis and then carry out the scalar quantization for those which have large quantization errors.

That is, for example, firstly the vector quantization is carried out to all the sub-vectors $y_k$ obtained by dividing the coefficients y on the frequency axis which have been subjected to the aforementioned T/F conversion. Here the vector quantization is carried out with the weight wk(j) defined as follows.

$$w_k(j) = w(kM+j)$$

The results of this quantization are connected to create $Q(y)_{VQ}$, from which a quantization error vector is created as follows.

$$e = y - Q(y)_{VQ}$$

From the elements e, a predetermined number of elements having a greater error are selected by some way, for example, by soring the error values. Alternatively, from the weight w, errors corresponding to a predetermined number having a greater value are selected. In the scalar quantization, the selected errors themselves are quantized. However, in this method, it is necessary to separately transmit side information on which coefficients have been subjected to the scalar quantization.

It should be noted that the present invention is not to be limited to the aforementioned embodiment. For example, it is also possible to carry out the aforementioned vector quantization after interleaving and dividing a given vector to be quantized into a pluraltiy of sub-vectors. That is, the coefficents on the frequency axis to be subjected to the vector quantization are successively divided one after another into a plurality of sub-vectors, starting at a lower band and there is no danger that coefficients within one sub-vector are concentrated in a vicinity of a predetermined band.

As is clear from the above description, according to the present invention, an input signal is subjected to a time axis/frequency axis conversion to obtain coefficients on the frequency axis, so that the coefficients subjected to scalar quantization and vector quantization are controlled according to the bit allocation of the coefficients on the frequency axis. This enables a reduced rate by the vector quantization while carrying out scalar quantization to those coefficients in which a quantization error is easily caused by the vector quantization, thus preventing deterioration of those coefficients. Moreover, the scalar quantization and the vector quantization are controlled according to the bit allocation and according there is no need of separately transmitting side information.

Here, the coefficients on the frequency axis having allocation bits equal to or more than a predetermined threshold value are subjected to scalar quantization. By carrying out scalar quantization of an isolated spectrum portion in which signal deterioration is caused by the vector quantization, it is possible to reduce quantization errors and enhance the signal quality.

In this process, for the coefficients quantized by the scalar quantization, the weight is set to 0, so that the vector quantization is carried out to all the coefficents. In comparison to a case of carrying out the vector quantization by taking out coefficients other than those subjected to the sclar quantization, the present invention enables the fixing of the vector quantization dimension number, which makes it unnecessary to adjust the dimension number in the vector quantization or select a codebook according to the dimension, thus simplifying the processing and system configuration. This can also be realized by using as an input to the vector quantization the quantization errors of the coefficients which have been subjected to the scalar quantization.

Moreover, by dividing an input vector into a plurality of sub-vectors before carrying out the vector quantization, it is possible to reduce the vector quantization codebook size, thus enabling the reduction of the load.

Furthermore, a time axis signal which has been normalized by feature extraction in advance is subjected to the aforementioned time axis/frequency axis conversion and a parameter of the normalization is used to calculate the aforementioned allocation bit, so that the normalization parameter can be used to uniquely define the selection control between the scalar quantization (SQ) and the vector quantization (VQ). Thus, it is unnecessary to transmit side information dedicated for the SQ/VQ control, thus preventing an increase of the transmission bit rate.

What is claimed is:

1. A signal coding method comprising the steps of:
   performing a time axis/frequency axis conversion on an input signal; and
   controlling a scalar quantization and a vector quantization according to a bit allocation of a coefficient on a frequency axis obtained by said time axis/frequency axis conversion and performing said scalar quantization and said vector quantization for said coefficient.

2. The signal coding method as set forth in claim 1, wherein
   said scalar quantization is performed for a coefficient having allocation bits of said bit allocation equal to or greater than a predetermined threshold value.

3. The signal coding method as set forth in claim 2, wherein
   said vector quantization is performed with a weight of zero on said coefficient quantized by said scalar quantization.

4. The signal coding method as set forth in claim 2, wherein
   for said coefficient quantized by said scalar quantization, a quantization error of said coefficient is used as an input to said vector quantization and a vector quantization output is added to an output of said scalar quantization.

5. The signal coding method as set forth in claim 1, wherein
   said vector quantization is performed by dividing an input vector into a plurality of sub-vectors and by switching between a plurality of codebooks according to a bit allocation for said respective plurality of sub-vectors.

6. The signal coding method as set forth in claim 1, wherein
   a time axis signal normalized by a feature extraction in advance is used as said input signal to said time axis/frequency axis conversion and a parameter for said normalization is used for calculating said allocation bit.

7. The signal coding method as set forth in claim 1, wherein
   said vector quantization is performed on a plurality of sub-vectors obtained by interleaving an input vector.

8. A signal coding method comprising the steps of:
   performing a time axis/frequency axis conversion on an input signal; and
   performing a vector quantization on each of a plurality of coefficients on a frequency axis obtained by said time axis/frequency axis conversion and performing a scalar quantization on coefficients of said plurality of coefficients having large quantization errors.

9. A signal coding apparatus comprising:
   time axis/frequency axis conversion means for performing a time axis/frequency axis conversion on an input signal;
   bit allocation means for obtaining a bit allocation of a coefficient on a frequency axis obtained by said time axis/frequency axis conversion; and
   quantization means for quantizing said coefficient while controlling a scalar quantization and a vector quantization according to said bit allocation.

10. The signal coding apparatus as set forth in claim 9, wherein
    said quantization means performs said scalar quantization on a coefficient having allocation bits of said bit allocation equal to or greater than a predetermined threshold value.

11. The signal coding apparatus as set forth in claim 10, wherein
    said quantization means performs said vector quantization with a weight of zero for said coefficient quantized by said scalar quantization.

12. The signal coding apparatus as set forth in claim 10, wherein for said coefficient quantized by said scalar quantization, said quantization means uses a quantization error of said coefficient as an input to said vector quantization and adds a vector quantization output to an output of said scalar quantization.

13. The signal coding apparatus as set forth in claim 9, further comprising normalization means for supplying said time axis/frequency axis conversion means with a time axis signal normalized by a feature extraction, wherein said bit allocation means obtains said bit allocation using a normalization parameter of said normalization means.

* * * * *